(12) United States Patent
Kwon et al.

(10) Patent No.: US 7,078,331 B2
(45) Date of Patent: Jul. 18, 2006

(54) METHOD OF FORMING REDISTRIBUTION BUMP AND SEMICONDUCTOR CHIP AND MOUNT STRUCTURE FABRICATED USING THE SAME

(75) Inventors: Yong-Hwan Kwon, Gyeonggi-do (KR); Sa-Yoon Kang, Seoul (KR); Chung-Sun Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/898,445

(22) Filed: Jul. 22, 2004

(65) Prior Publication Data

US 2005/0017343 A1    Jan. 27, 2005

(30) Foreign Application Priority Data

Jul. 23, 2003    (KR) .................... 10-2003-0050496

(51) Int. Cl.
*H01L 21/44*    (2006.01)
(52) U.S. Cl. .................. 438/612; 438/618; 438/666; 438/669; 438/613; 257/E23.021; 257/E23.168
(58) Field of Classification Search ........ 438/611–614, 438/618, 666, 669; 257/E23.021, E23.168, 257/773, 786
See application file for complete search history.

(56) References Cited

U.S. PATENT DOCUMENTS

| 5,834,844 | A  | * | 11/1998 | Akagawa et al. ........... 257/734 |
| 6,329,608 | B1 | * | 12/2001 | Rinne et al. ................ 174/261 |
| 6,362,087 | B1 | * | 3/2002  | Wang et al. ................ 438/597 |

FOREIGN PATENT DOCUMENTS

KR    2001-009429    2/2001

OTHER PUBLICATIONS

English language abstract of the Korea Publication No. 2001-0009429.

* cited by examiner

*Primary Examiner*—Nitin Parekh
(74) *Attorney, Agent, or Firm*—Marger Johnson & McCollom, P.C.

(57) ABSTRACT

Provided are a method of forming a bump whose upper surface is substantially flat and whose area can be enlarged in a uniform pad pitch to simplify mounting a liquid crystal display drive IC (LDI) and a semiconductor chip and a mount structure using the method to minimize a pad area inside the chip. Thus, the pad area on an edge of a conventional chip is minimized and the bump is formed in a substantially flat location inside the chip and an electrical connection between the pad and the bump is performed by a redistribution metal line.

11 Claims, 10 Drawing Sheets

METHOD OF FORMING REDISTRIBUTION BUMP AND SEMICONDUCTOR CHIP AND MOUNT STRUCTURE FABRICATED USING THE SAME

BACKGROUND OF THE INVENTION

This application claims the priority of Korean Patent Application No. 2003-50496, filed on Jul. 23, 2003, in the Korean Intellectual Property Office, the disclosure of which is incorporated herein in its entirety by reference.

1. Field of the Invention

The present invention relates to a semiconductor chip and a mount structure, and more particularly, to a liquid crystal display drive IC (LDI) chip and the mount structure in which the chip is connected to an external electronic device by a bump.

2. Description of the Related Art

A liquid crystal display (LCD) is a flat-panel display having the excellent characteristics of thinness, light-weight, and low power consumption. In addition, the LCD also has such characteristics of high resolution, high color display, and high definition.

As is well known, the LCD is made up of a liquid crystal panel (LCP) having liquid crystal injected between two substrates (an array and color filter substrate), a back light in a lower portion of the LCP, and a drive unit at an outer ring of the LCP to drive the LCP. The LCP consists of pixels in a matrix shape between two glass substrates with a switching device for controlling signals respectively supplied to the pixels, like a thin-film transistor.

The drive unit includes a printed circuit board (PCB), comprising hardware to generate control and data signals, and a liquid crystal display drive IC (LDI) which connects to the LCP and PCB to signal a LCP wire. Mount structures for an LDI chip include chip on glass (COG), tape carrier package (TCP), chip on film (COF), etc. LDI chip mounting requires a fine pitch connection, an easy connecting process, and high reliability to meet a trend in a complicated structure of the LDI chip, an increase in the number of pixels, and obtain high resolution. An exemplary technology for meeting this trend is a method of forming an Au bump and bonding a fine pad pitch.

FIGS. 1 through 4 show a manufacturing method of a conventional Au bump used in mounting a LDI chip.

FIG. 1 illustrates coating a chip in a wafer-state 1 with a passivation film 5 and covering an open Al pad 3 with polyimide and patterning to expose the Al pad 3.

FIG. 2 illustrates forming an under bump metallurgy (UBM) layer 9 by sputtering in an upper portion of the intermediate structure obtained in FIG. 1, and forming a photoresist pattern 11 having a hole A in a corresponding location to the Al pad 3 on the UBM layer 9.

A bump 13 is formed by filling the hole A with Au layers via Au electroplating as shown in FIG. 3, and photoresist pattern 11 is removed via stripping as illustrated in FIG. 4. Next, an etching process of the UBM layer 9 is performed so that the UBM layer 9 remains in a lower portion of the bump 13. The remaining UBM layer is indicated as 9a in FIG. 4.

The bump 13 is conventionally formed on the Al pad 3, thus exposing the passivation film 5 on the lower portion of the bump. The exposed passivation film 5 on the lower portion of the bump 13 makes it difficult to overcome step difference and, furthermore, causes the step difference in an upper portion of the bump 13. Additionally, the rough upper portion of the bump hampers the bonding process, and chip size is inevitably big due to the formation of the bump 13 on the Al pad 3. To simplify manufacturing, the size of bump 13 and the space between bumps 13 can be large. It is also difficult to embody the fine pad pitch since the Al pad 3 is disposed in a circumferential pad area separated from a cell (or circuit) area.

FIG. 5 displays a conventional redistribution bump 28. The upper portion of the bump 28 may be rough and an edge of the bump 28 may have protrusions as the bump 28 is formed by leaving the UBM layer 26 as a via for electrical connection in a bump formation location, and protecting a remaining area via the passivation film 27 after forming the redistribution metal wire 25. Reference numerals 21, 22, 23, and 24 indicate a chip in a wafer-state, an Al pad, and first and second passivation films, respectively.

SUMMARY OF THE INVENTION

The present invention provides a method of forming a bump to simplify an assembly of a semiconductor chip and to minimize a pad area inside the chip. In addition, the present invention also provides a semiconductor chip that is easy to assemble using the method above and a reliable chip mount structure.

According to an aspect of the present invention, there is provided a method of forming a redistribution bump. The method includes: forming a first passivation film partially exposing an upper portion of a pad on the upper portion of a wafer-state chip in which the pad is formed; forming a second passivation film to expose the upper portion of the pad and a circumferential first passivation film; forming a redistribution metal layer along a surface in which the second passivation film is formed; forming a bump adjoining the redistribution metal layer on the second passivation film in a substantially flat location detached from a location of the pad; etching the redistribution metal layer to leave only a metal line having a predetermined width under the bump; and forming a third passivation film protecting the redistribution metal line and exposing the bump.

According to another aspect of the present invention, there is provided a semiconductor chip including: a bump used in an electrical connection between the semiconductor chip pad and the external electronic device, wherein the bump having a substantially flat upper surface is formed in a substantially flat location beyond a location of a pad and is connected to the pad via a redistribution metal line.

The pad and the bump may have at least one layered substantially flat passivation film formed therebetween and the bump may be made of one of gold and a gold alloy. In addition, the redistribution metal line covering the upper portion of the pad can be extended under the bump. Furthermore, the redistribution metal line and the bump may have an additional redistribution metal line formed therebetween and the additional redistribution metal line may be made of Au, an Au alloy, or Ni/Au.

According to still another aspect of the present invention, there is provided a semiconductor chip including: a first passivation film covering a pad formed on an upper portion of the chip and partially exposing the upper portion of the pad; a second passivation film formed on the first passivation film to expose the upper portion of the pad and a circumferential first passivation film; a bump having a substantially flat surface that is formed on the upper portion of the second passivation film in a substantially flat location detached from a location of the pad; a redistribution metal line extended from the upper portion of the pad to a lower portion of the bump for an electrical connection between the pad and the bump; and a third passivation film exposing the bump and protecting the redistribution metal line.

The semiconductor chip mounted on a liquid crystal panel has a mount structure in which the bump and an electrode of the LCP are connected.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
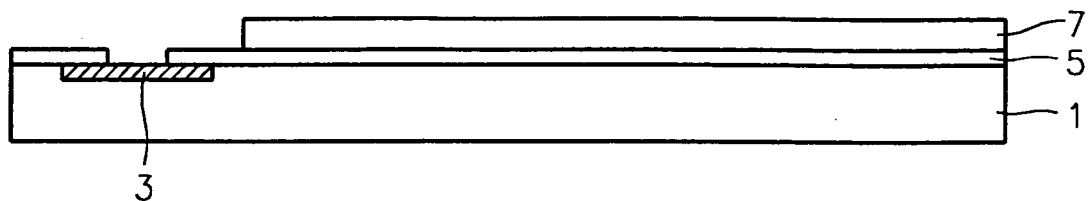
FIGS. 1 through 4 are drawings illustrating a method of manufacturing a conventional Au bump used in mounting a liquid crystal display drive IC (LDI) chip.
Figure 2:
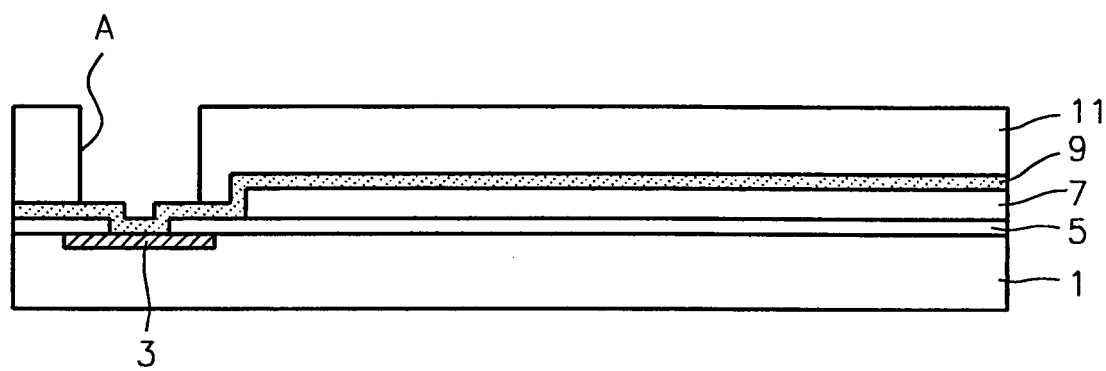
Figure 3:
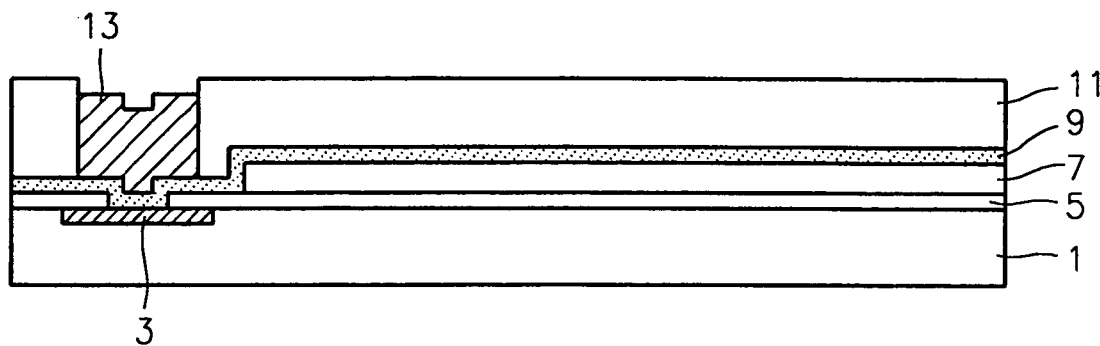
Figure 4:
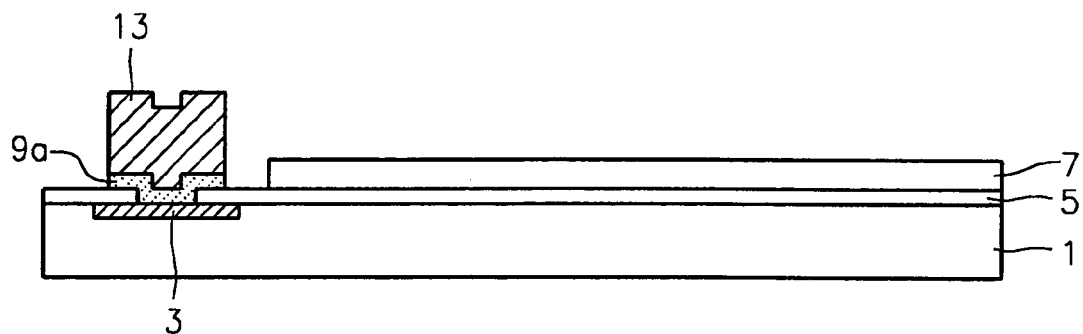
Figure 5:
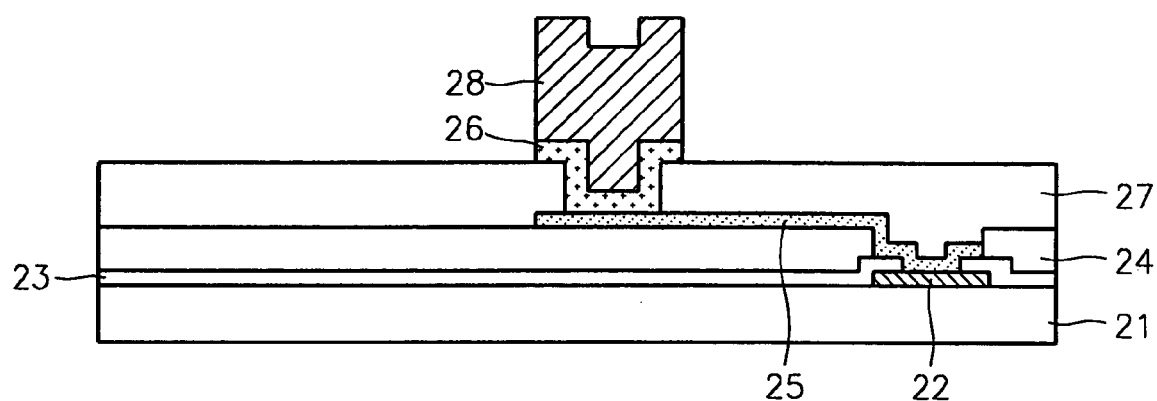
FIG. 5 displays a conventional redistribution bump.

The present invention will now be described more fully with reference to the attached drawings, in which exemplary embodiments thereof are shown. This invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the forms of the elements are exaggerated for clarity. To facilitate understanding, identical reference numerals have been used to designate identical elements that are common to the figures.

A method of forming a redistribution bump according to a first embodiment of the present invention will be explained with reference to FIGS. 6 through 12.

Figure 6:
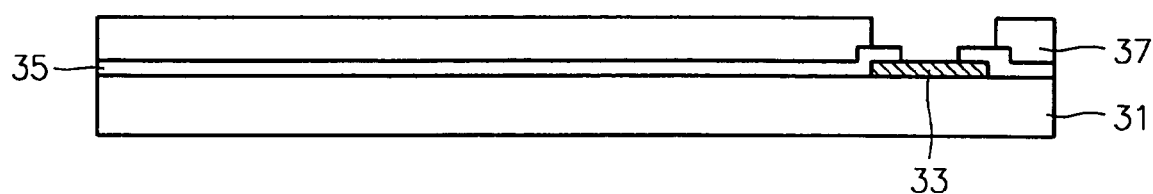
FIGS. 6 through 12 are cross-sections illustrating a method of forming a redistribution bump according to an embodiment of the present invention.

Referring to FIG. 6, a first passivation film 35 is applied onto an upper portion of a wafer-state chip 31 in which a plurality of semiconductor devices are formed. The upper portion of an Al pad 33, to transmit signals between the semiconductor device and an external electronic device, is exposed by partially etching the first passivation film 35. The first passivation film 35 may comprise a silicon oxide and nitride film. The Al pad 33 may be exposed by a photolithography and etching process. A second passivation film 37, such as polyimide, may be formed over the first passivation film 35 and the Al pad 33 via spin coating. The second passivation film 37 is patterned to expose a portion of the Al pad 33. The second passivation film 37 may comprise, for example, polyetherimide, epoxy, or silicon resin.

Figure 7:
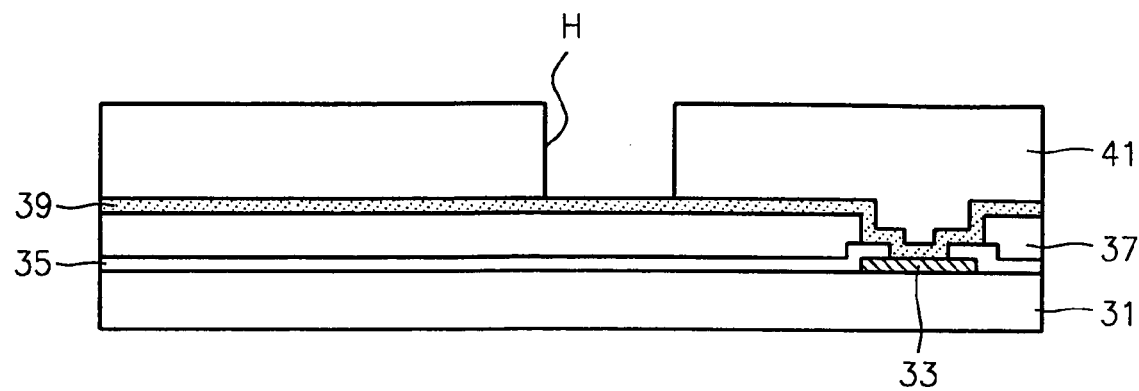

In the embodiment in FIG. 7, a metal layer 39 is formed over the intermediate structure obtained in FIG. 6. The metal layer 39 may be formed, for example, by evaporation, sputtering, or plating. The plating method may include electronic and electroless plating. The manufacturing process of the metal layer 39 may comprise a redistribution process for shifting locations, forming an external terminal or a bump in a subsequent process. According to an embodiment of the present invention, the metal layer 39 can function as an under bump metallurgy (UBM) layer for forming the bump in the subsequent process. Accordingly, the metal layer 39 may be layered by a compound material made out of TiW, Au, Cr, Cu, Ti, Ni, NiV, and Pd, combinations thereof, etc., to enhance connection reliability between the bump and the Al pad 33.

After forming the metal layer 39, a photoresist is applied and a first photoresist pattern 41 is formed by leaving an opening H in a location where the bump for a connection will be formed. The opening H is made on a flat surface and is detached from the Al pad 33, unlike the conventional method.

Figure 8:
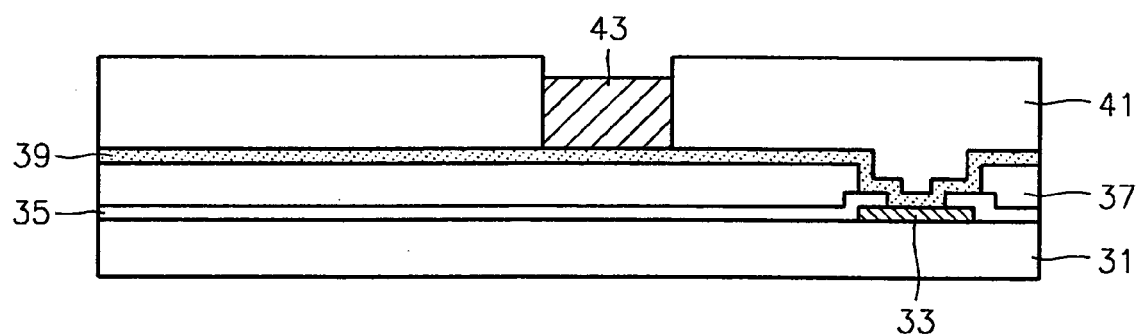

Referring to FIG. 8, a bump 43 may be formed by filling the opening H with one of gold and a gold alloy via electroplating. The opening H may be formed in a flat location, and thus the bump 43 formed inside the opening H may have a flat upper surface without step difference. Other bump formation methods such as evaporation and sputtering may be used instead of the plating method.

Figure 9:
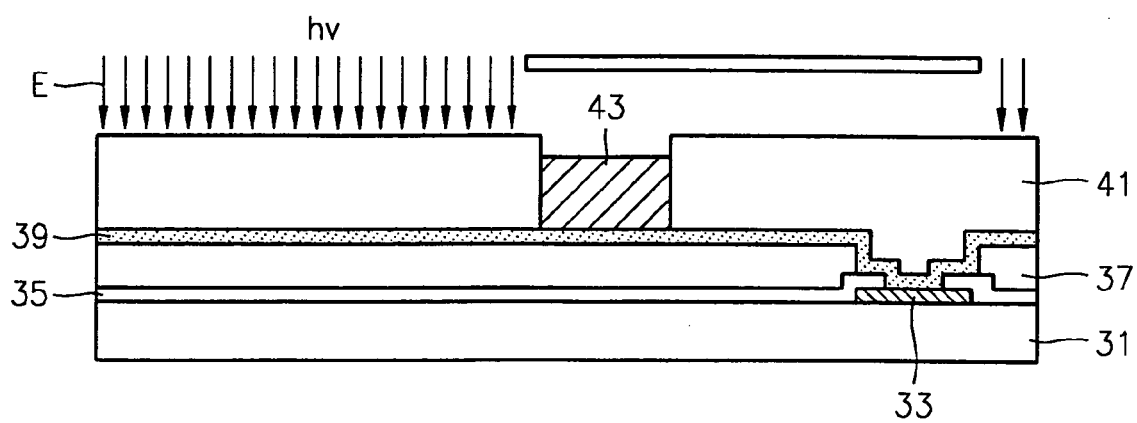
Figure 10:
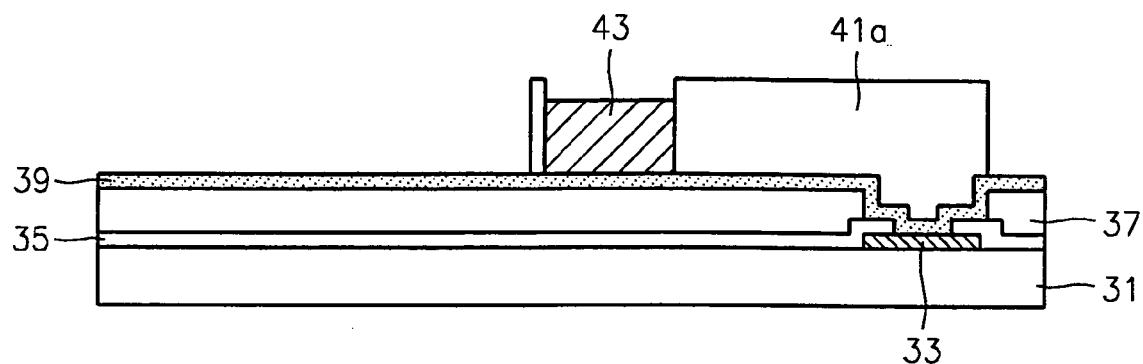

In the embodiment in FIG. 9, a mask is used and an exposure E is performed on the first photoresist pattern 41 to set away from the opening of the first passivation film 35 in the Al pad 33 to the bump 43. After developing the first photoresist pattern 41, as illustrated in FIG. 10, the second photoresist pattern 41a is formed covering the opening of the first passivation film 35 in the Al pad 33 and the bump 43 and partially exposing the metal layer 39.

Figure 11:
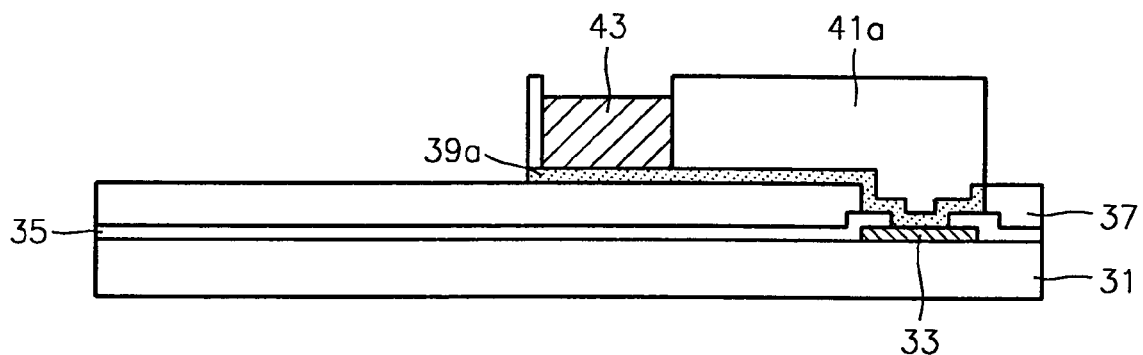

Then, referring to FIG. 11, the metal line 39 exposed under the second photoresist pattern 41a is removed by etching. A reference numeral 39a indicates a remaining redistribution metal line.

Figure 12:
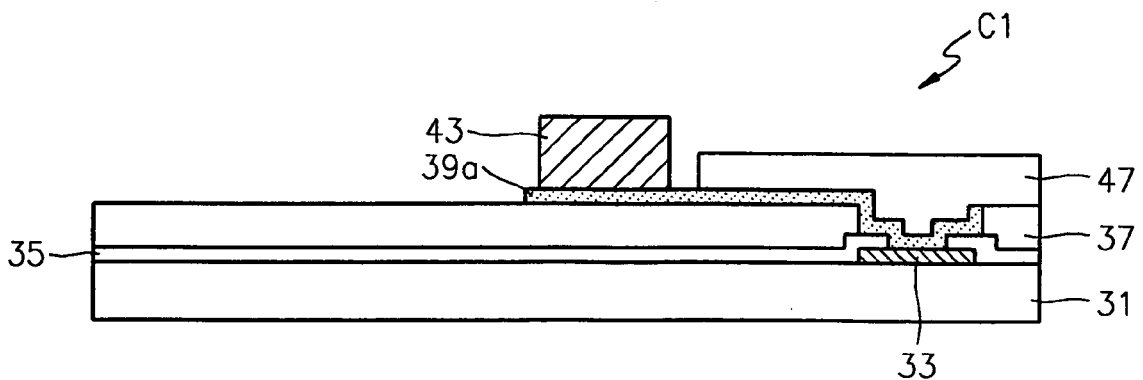

Referring to FIG. 12, a third passivation film 47 is formed to protect the remaining exposed redistribution metal line 39a after removing the second photoresist pattern 41a in FIG. 11 and leaving a portion of the bump 43. The third passivation film 47 can be made of polyimide, polyetherimide, epoxy, and silicon resin, for example. A method of forming the third passivation film 47 may be one of spin coating and patterning. After dicing the wafer, a process of separating the semiconductor chip from the wafer piece by piece is performed, and then the separated semiconductor chip is mounted. The separated chip C1 can be formed to be a mount structure such as a chip on glass (COG), a tape carrier package (TCP), a chip on film (COF), etc.

As described above, the bump 43 is formed on the second passivation film 37 and placed in a flat location slightly detached from an area of the Al pad 33 rather than being directly on the Al pad 33. An electrical connection between the Al pad 33 and the bump 43 is made by the redistribution metal line 39a. Thus, a flat surface of an upper portion of the bump without any step difference can be obtained in a final chip structure C1, and thereby simplifying the bonding process and increasing reliability of connected parts. Furthermore, chip size need not change despite a bigger bump size. Bump 43 may be enlarged even though the Al pad 33 is embodied in a fine pitch. In addition, the pitch of the Al pad 33 can be minimized to reduce chip size because the Al pad 33 made with a fine pitch does not influence the size of the bump 43.

As illustrated in FIG. 12, a semiconductor chip C1 with the bump 43 formed by the aforementioned method includes the first passivation film 35 covering and partially exposing the pad 33 formed on an upper portion of the chip. The second passivation film 37 is formed on the first passivation film 35 exposing the upper portion of the pad 33 and the nearby first passivation film 35. The bump 43 has a flat upper surface since it is formed on the second passivation film 37 in a flat location detached from the pad location. The electrical connection is performed by the redistribution metal line 39a extended from the upper portion of the pad to a lower portion of the bump 43. The bump 43 is exposed and the redistribution metal line 39a is protected by the third passivation film 47.

As described above, this semiconductor chip has a simple bonding process and an enhanced reliability of connected parts since a substantially flat surface can be obtained without an occurrence of step difference on the upper portion of the bump 43.

FIGS. 13 through 16 are cross-sections illustrating a method of forming a redistribution bump according to a second embodiment of the present invention. Identical reference numerals have been used to designate identical elements throughout FIGS. 6 to 12. Overlapping explanations with the first embodiment are omitted.

Figure 13:
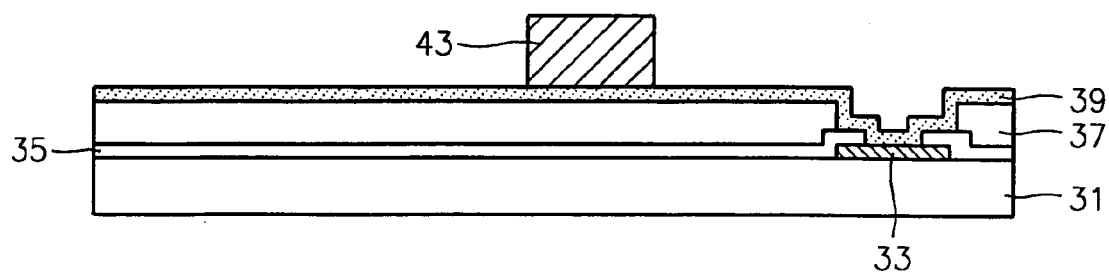
FIGS. 13 through 16 are cross-sections illustrating a method of forming a redistribution bump according to another embodiment of the present invention.

An explanation on the second embodiment will follow one on bump formation in FIGS. 6 through 8. In one embodiment of the present embodiment, the first photoresist pattern 41 used in forming the bump 43 is removed by ashing and stripping as shown in FIG. 13.

Figure 14:
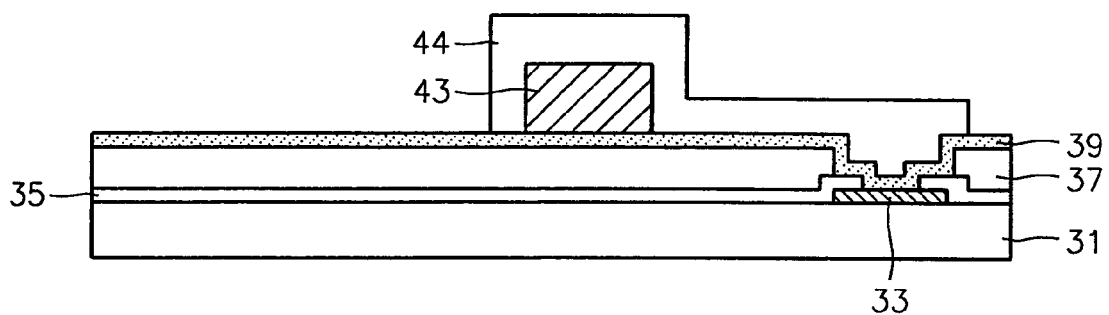
Figure 15:
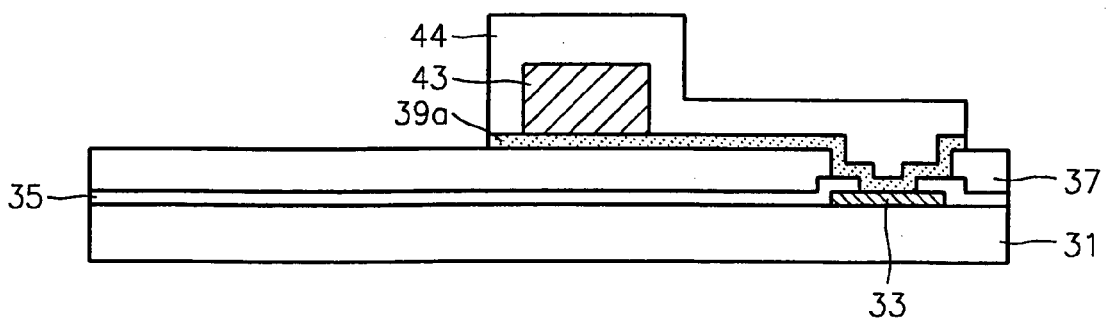

Referring to FIG. 14, a new photoresist pattern 44 is formed a predetermined width from an opening of the first passivation film 35 in the Al pad 33 to the bump 43. The redistribution metal line 39a remains as presented in FIG. 15 by etching the metal layer 39 while using the photoresist pattern 44 as an etching mask.

Figure 16:
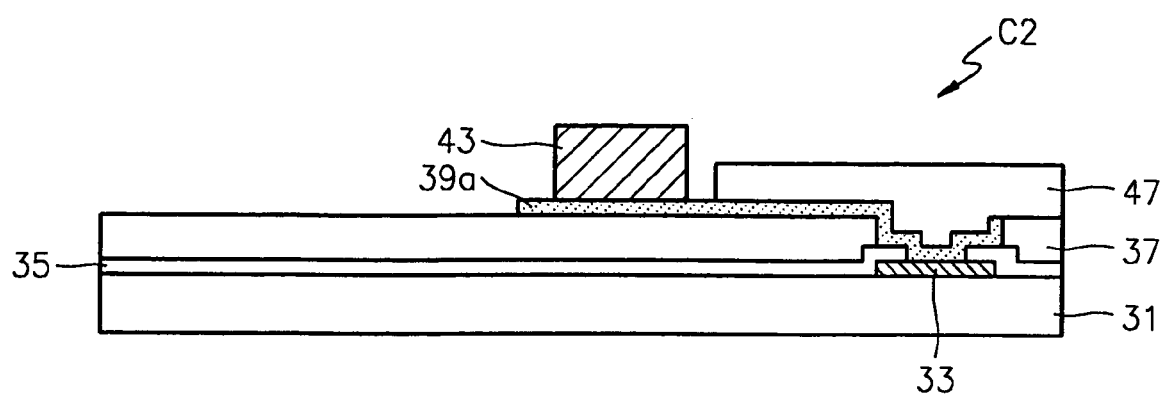

After removing the photoresist pattern 44, a chip structure C2 is obtained as shown in FIG. 16 by forming the third passivation film 47 as explained in FIG. 12.

Although the second photoresist pattern 41 a is formed by additionally exposing the first photoresist pattern 41 in the first embodiment, the new photoresist pattern 44 is formed after removing the first photoresist pattern 41 in the present embodiment. The new photoresist pattern 44 is capable of coating the upper portion of the bump 43 and can protect the bump 43 from damage when etching the lower portion of metal layer 39.

FIGS. 17 through 21 are cross-sections illustrating a method of forming a redistribution bump according to a third embodiment of the present invention. Overlapping explanations of the first and second embodiment will be omitted.

Figure 17:
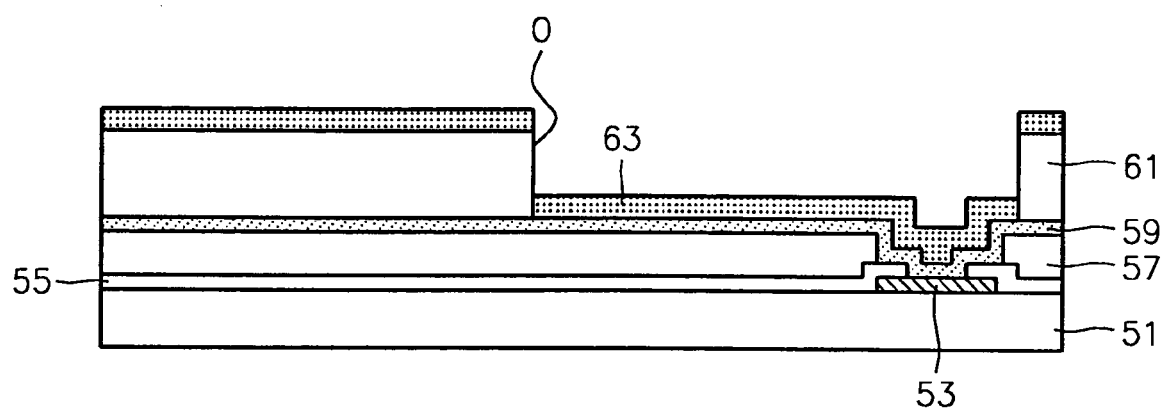
FIGS. 17 through 21 are cross-sections illustrating a method of forming a redistribution bump according to still another embodiment of the present invention.

Referring to FIG. 17, an upper portion of an Al pad 53 is exposed by applying and patterning a first passivation film 55 on an upper portion of a wafer-state chip 51. After applying and patterning a second passivation film 57, a portion of the Al pad 53 is exposed.

A metal layer 59 may be formed over the resulting structure including the second passivation film 57. Example metal layers 59 include TiW, Au, Cr, Cu, Ti, Ni, NiV, Pd, and a layered film may be made of combinations of these eight materials. Then, a first photoresist pattern 61 is formed on the metal layer 59. The first photoresist pattern 61 has an opening O at a location where an additional redistribution metal line for the electrical connection will be formed. The additional redistribution metal layer 63 is formed in the opening O using electroplating. One of Au, an Au alloy, and Ni/Au with a thickness of 0.1um~20 um may be used for the additional redistribution metal layer 63.

Figure 18:
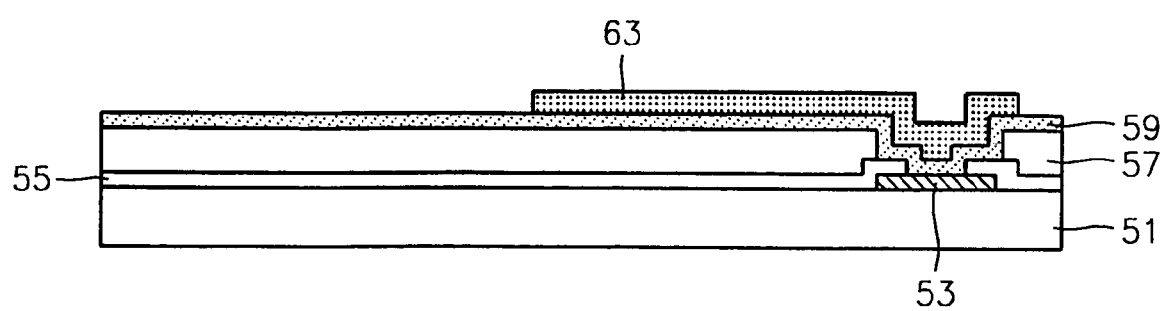

Thereafter, the first photoresist pattern 61 is removed by stripping, as shown in FIG. 18.

Figure 19:
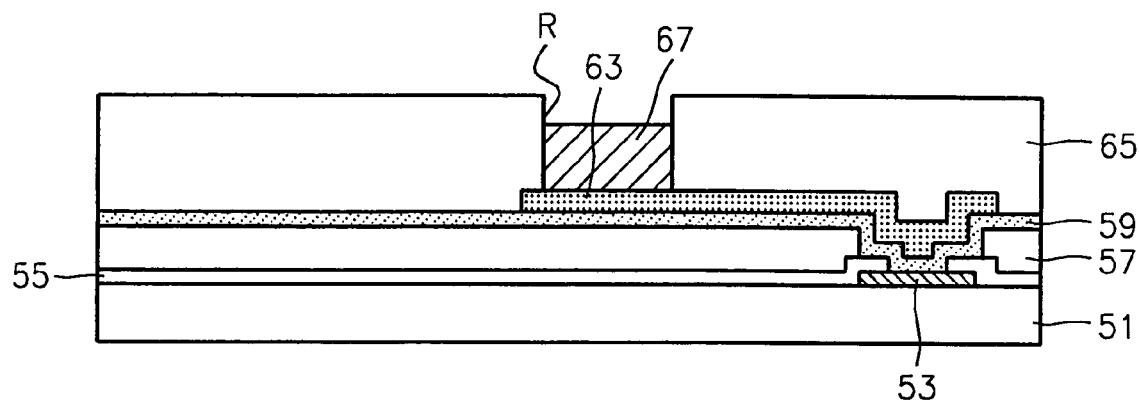

Referring to FIG. 19, a second photoresist pattern 65 is formed over the metal layer 59. The second photoresist pattern 65 has an opening R in which a bump can be formed. A bump 67 may be formed, for example, by filling gold or a gold alloy inside the opening R via electroplating.

Figure 20:
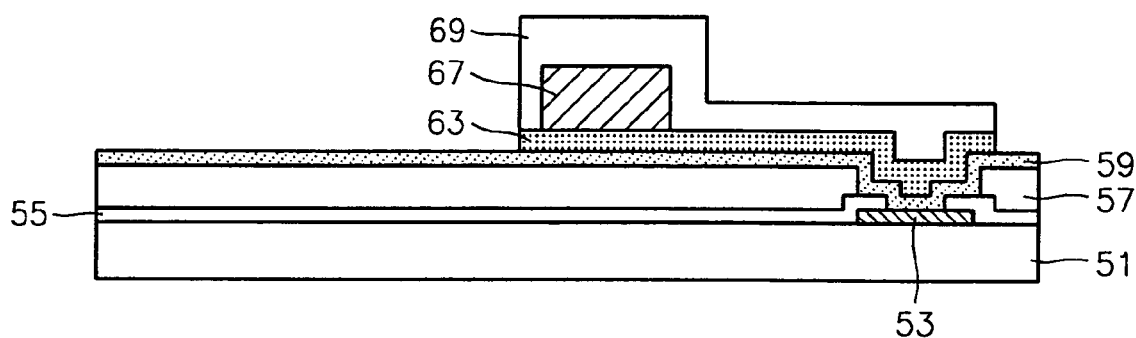
Figure 21:
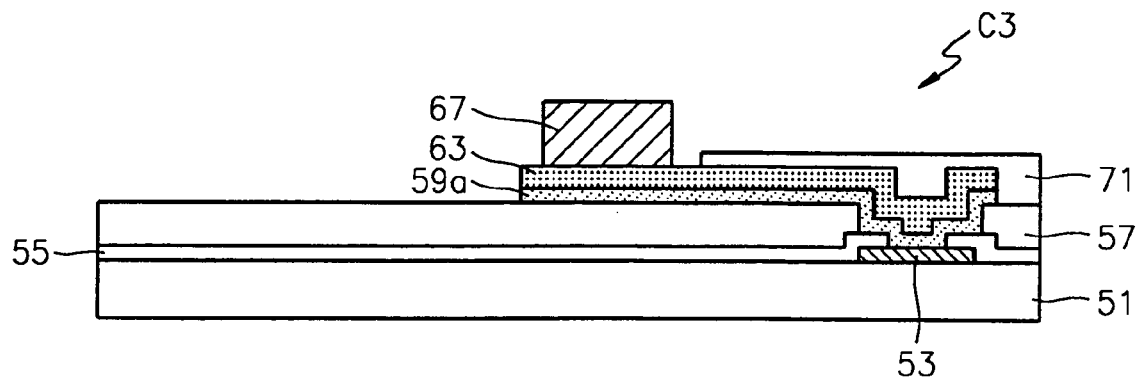

Referring to FIG. 20, the second photoresist pattern 65 used in forming the bump 67 is removed. Thereafter, a third photoresist pattern 69 is formed to set a predetermined width away from the opening of the first passivation film 55 in the Al pad 53 to the bump 67. The third photoresist pattern 69 may be formed by additionally exposing and developing the second photoresist pattern 65, instead of removing it. Using the third photoresist pattern 69 as an etching mask, the metal layer 59 is etched, and the metal line 59a is left as shown in FIG. 21. Then, after removing the third photoresist pattern 69, a final chip structure C3 is obtained by forming a third passivation film 71 so as to expose the bump 67.

In the embodiments of the present embodiment, like the first and second embodiment, the upper portion of the bump 67 is substantially flat, and thus simplifying a bonding process. However, unlike the first and second embodiment, the additional redistribution metal line 63 prevents a short circuit and enhances the reliability of the present embodiment.

A bump having a flat upper surface is obtained as described in FIGS. 12 and 21, based on the aforementioned method. Various mount structures are possible according to a method of mounting a chip structure having such a bump. FIGS. 22 through 25 are cross-sections illustrating various examples of mount structures with a high reliability using a semiconductor chip structure according to a fourth embodiment of the present invention. For convenience, examples of mounting the chip C1 in the first embodiment are illustrated.

Figure 22:
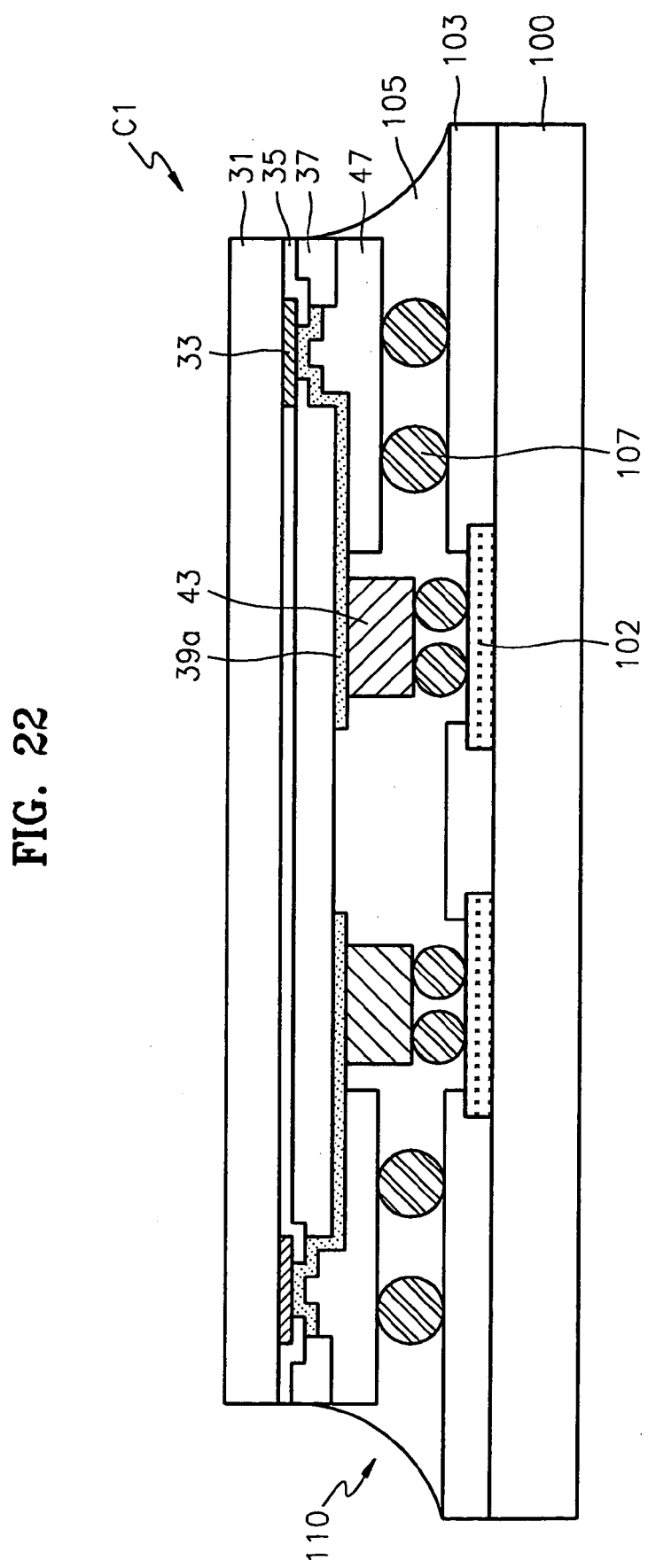
FIGS. 22 through 25 are cross-sections illustrating various examples of mount structures using a semiconductor chip structure according to embodiments of the present invention.

A chip on glass (COG) mount structure in which the chip C1 is mounted on a liquid crystal panel (LCP) 100 is illustrated in an embodiment shown in FIG. 22. Specifically, the chip C1 having the bump 43 according to an embodiment of the present invention is thermally pressured using an anisotropic conductive film (ACF) 110 and is mounted on the LCP 100. The ACF 110 has a small conductive particle 107 in a thermosetting resin film 105. After the ACF is adhered to an electrode 102 (or a pad) of the LCP 100 in which conductive adhesion is performed and the bump 43 is attached to the electrode 102, the electrical connection is made vertically through a thermal pressure process. The conductive particle 107 may be a polymer or a glass ball coated by gold, silver, or nickel. A reference numeral 103 is an insulation film.

Figure 23:
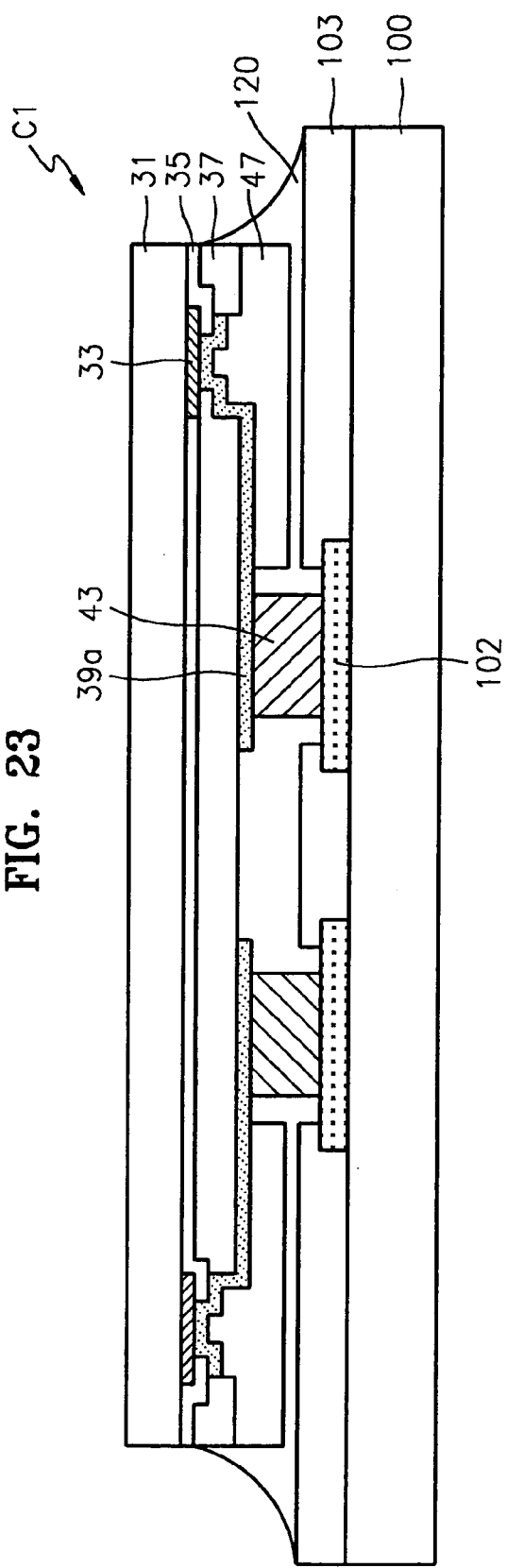

A COG mount structure in which the chip C1 is mounted on the LCP 100 is illustrated in the embodiment in FIG. 23. Particularly, the chip C1 having the bump 43 according to an embodiment of the present invention is thermally pressured using a non-conductive paste (NCP) 120 and is mounted on a LCP 100.

Figure 24:
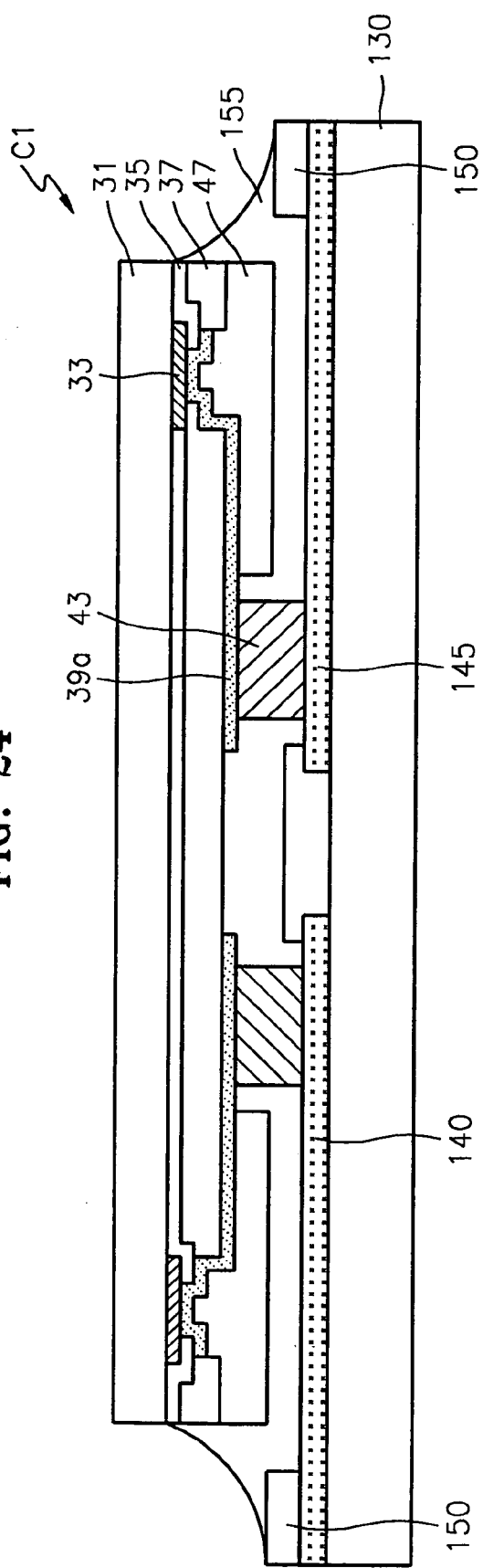
Figure 25:
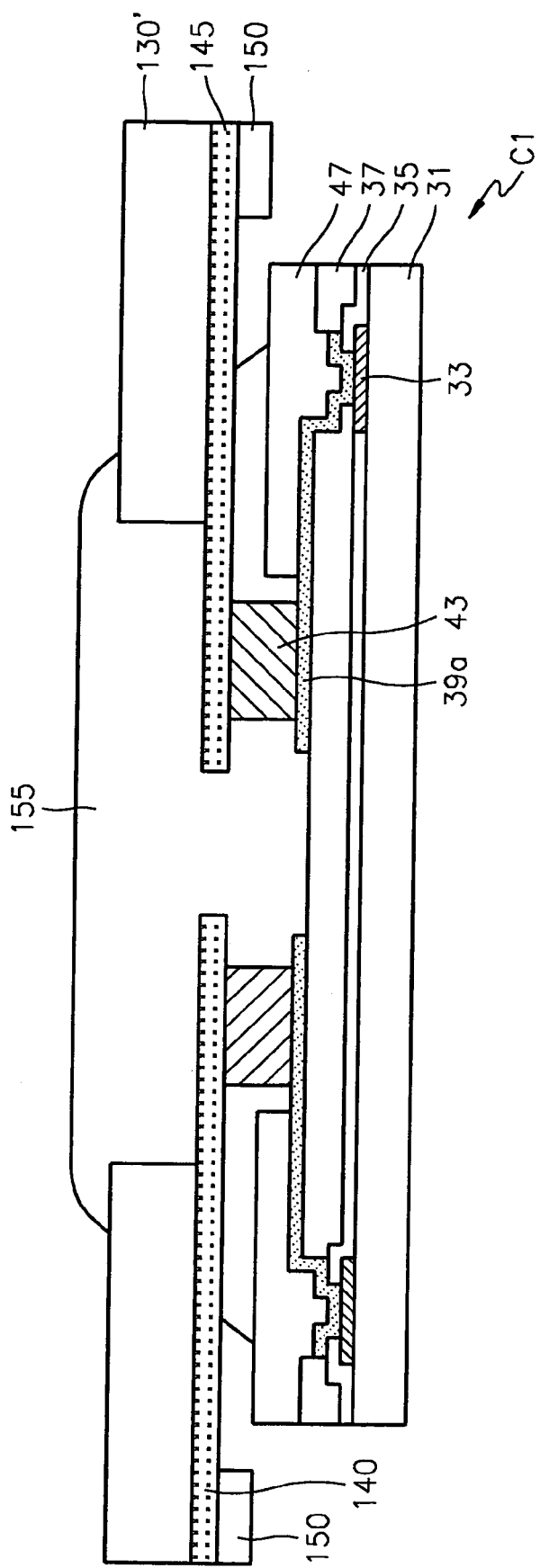

FIGS. 24 and 25 are cross-sections of a chip on film (COF) and a tape carrier package (TCP) mount structure, respectively. While the COG mount structure as described in FIGS. 22 and 23 has a bigger-sized LCD from mounting the chip on the LCP, the COF and TCP structures may be compact since the chip is mounted using an extra film, and thus the film having the chip can be bent toward a rear side of the LCP.

Referring to FIGS. 24 and 25, mutually corresponding first and second signal wires (or copper lead) 140 and 145 are plurally formed on a base film 130 formed of a material such as polyimide and a solder resist 150 is formed on the first and second signal wires 140 and 145, respectively. The solder resist 150 also exposes a portion of the first and second signal wires 140 and 145, respectively. Then, a chip is disposed so that each bump 34 contacts with the first and second signal wires 140 and 145. The chip and the first and second signal wires 140 and 145 are connected via the bump 43. In addition, a resin 155 is formed on both ends of the chip and covers the solder resist 150, the first and second signal wires 140 and 145, and the bump 43.

The TCP mount structure in FIG. 25 is similar with the mount structure in FIG. 24, except that the former has the base film 130 with a hollow center portion.

The mount structure including a semiconductor chip with a redistribution bump as presented in the present invention has excellent connection reliability since the mount structure uses a substantially flat bump.

As described above, the bump having the flat upper surface and is capable of expanding an area within the same pitch can be formed according to embodiments of the present invention. In addition, it is not necessary for such a bump to increase the pad area inside the chip. Thus, manufacturing costs can be lowered by increasing the number of net dies and decreasing the chip size. This feature is very useful for LDI fine pitch products.

Furthermore, since the flat upper surface of the bump can simplify the assembling process and obtain tolerance and can reduce defects in the assembly, a manufacturing process of the circuit thin film is simplified, therefore reducing processing costs.

While the present invention has been particularly shown and described with reference to exemplary embodiments thereof, it will be understood by those of ordinary skill in the art that various changes in form and details may be made without departing from the spirit and scope of the present invention as defined by the following claims.

What is claimed is:

1. A method of forming a semiconductor device, the method comprising:
    preparing a wafer-state chip having a pad formed thereon;
    forming a first passivation film overlying the chip, the first passivation film partially exposing an upper portion of the pad;
    forming a second passivation film to expose the upper portion of the pad and a portion of the first passivation film;
    forming a redistribution metal layer on the second passivation film, the redistribution metal layer having a substantially flat surface;
    forming a bump on the substantially flat surface spaced apart from the pad and then etching a portion of the redistribution metal layer to form a metal line extending under the bump; and
    forming a third passivation film protecting the redistribution metal line and exposing the bump.

2. The method of claim 1, wherein forming the bump comprises:
    forming a first photoresist pattern on the redistribution metal line,
    wherein the first photoresist pattern has an opening on the upper portion of the second passivation film in the substantially flat location detached from the location of the pad;
    forming the bump by filling the opening with metal; and
    removing the first photoresist pattern.

3. The method of claim 1, wherein forming the bump and etching the redistribution metal layer comprise:
    forming a first photoresist pattern on the redistribution metal line,
    wherein the first photoresist pattern has an opening on the upper portion of the second passivation film in the substantially flat location detached from the location of the pad;
    forming the bump by filling the opening with metal;
    forming a second photoresist pattern covering the pad and the bump by exposing and developing the first photoresist pattern;
    etching a portion of the redistribution metal layer, using the second photoresist pattern as an etching mask; and
    removing the second photoresist pattern.

4. The method of claim 1, wherein forming the bump and etching the redistribution metal layer comprise:
    forming a first photoresist pattern on the redistribution metal layer,
    wherein the first photoresist pattern has an opening on the upper portion of the second passivation film in the substantially flat location detached from the location of the pad;
    forming the bump inside the opening;
    removing the first photoresist pattern;
    forming a second photoresist pattern covering the pad and the bump;
    etching a portion of the redistribution metal layer, using the second photoresist pattern as an etching mask; and
    removing the second photoresist pattern.

5. The method of claim 1, wherein the redistribution metal layer is made using one of evaporation, sputtering, and plating.

6. The method of claim 1, wherein the redistribution metal layer is made of one selected form the group consisting of TiW, Au, Cr, Cu, Ti, Ni, Niv, Pd, and a compound line made of at least two of TiW, Au, Cr, Cu, Ti, Ni, NiV, Pd.

7. The method of claim 1, wherein the bump is made of one of gold and a gold alloy.

8. The method of claim 1, wherein the redistribution metal line and bump have an additional redistribution metal line formed therebetween.

9. The method of claim 8, wherein the additional redistribution metal line is made of one selected from the group consisting of Au, an Au alloy, and a Ni/Au.

10. A method of forming a semiconductor device, the method comprising:
    preparing a wafer-state chip having a pad formed thereon;
    forming a first passivation film overlying the chip, the first passivation film partially exposing an upper portion of the pad.
    forming a second passivation film to expose the upper portion of the pad and a portion of the first passivation film;
    forming a redistribution metal layer on the second passivation film, the redistribution metal layer having a substantially flat surface;
    forming a first photoresist pattern on the redistribution metal layer, wherein the first photoresist pattern has an opening on the upper portion of the second passivation film in the substantially flat location detached from the location of the pad;
    forming a bump on the substantially flat surface spaced apart from the pad by filling the opening With metal;
    etching a portion of the redistribution metal layer using the second photoresist pattern as an etching mask to form a metal line extending under the bump;

forming a second photoresist pattern covering the pad and the bump by exposing and developing the first photoresist pattern;

removing the second photoresist pattern; and forming a third passivation film protecting the redistribution metal line and exposing the bump.

11. A method of forming a semiconductor device, the method comprising:

preparing a wafer-state chip having a pad formed thereon;

forming a first passivation film overlying the chip, the first passivation film partially exposing an upperportion of the pad;

forming a second passivation film to expose the upper portion of the pad and a portion of the first passivation film;

forming a redistribution metal layer on the second passivation film, the redistribution metal layer having a substantially flat surface;

forming a first photoresist pattern on the redistribution metal layer, wherein the first photoresist pattern has an opening on the upper portion of the second passivation film in the substantially flat location detached from the location of the pad;

forming a bump on the substantially flat surface spaced apart from the pad inside the opening.

removing the first photoresist pattern;

forming a second photoresist pattern covering the pad and the bump;

etching a portion of the redistribution metal layer, using the second photoresist pattern as an etching mask to form a metal line extending under the bump;

removing the second photoresist pattern; and forming a third passivation film protecting the redistribution metal line and exposing the bump.

* * * * *

UNITED STATES PATENT AND TRADEMARK OFFICE
CERTIFICATE OF CORRECTION

PATENT NO. : 7,078,331 B2
APPLICATION NO. : 10/898445
DATED : July 18, 2006
INVENTOR(S) : Yong-Hwan Kwon et al.

It is certified that error appears in the above-identified patent and that said Letters Patent is hereby corrected as shown below:

Column 8, line 34, the word "form" should read -- from --;
Column 8, line 51, the word "pad." should read -- pad; --;
Column 8, line 64, the word "With" should read -- with --;
Column 9, line 11, the word "upperportion" should read -- upper portion --.

Signed and Sealed this

Twenty-eighth Day of July, 2009

JOHN DOLL
*Acting Director of the United States Patent and Trademark Office*